(12) United States Patent
Hammerschmidt (10) Patent No.: US 11,448,525 B2
(45) Date of Patent: Sep. 20, 2022

(54) SENSOR DEVICES WITH TEST MAGNETS, AND ASSOCIATED METHODS

(71) Applicant: Infineon Technologies AG, Neubiberg (DE)

(72) Inventor: Dirk Hammerschmidt, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 193 days.

(21) Appl. No.: 16/893,641

(22) Filed: Jun. 5, 2020

(65) Prior Publication Data

US 2020/0386576 A1 Dec. 10, 2020

(30) Foreign Application Priority Data

Jun. 6, 2019 (DE) .......................... 102019115373.5

(51) Int. Cl.
*G01R 5/14* (2006.01)
*G01D 5/14* (2006.01)
*G01R 33/09* (2006.01)
*G01R 33/07* (2006.01)
*G01D 5/16* (2006.01)
*G01R 33/00* (2006.01)
*G01R 15/20* (2006.01)
*G01R 19/00* (2006.01)

(52) U.S. Cl.
CPC ............... *G01D 5/145* (2013.01); *G01D 5/16* (2013.01); *G01R 15/202* (2013.01); *G01R 15/205* (2013.01); *G01R 19/0092* (2013.01); *G01R 33/0017* (2013.01); *G01R 33/0082* (2013.01); *G01R 33/07* (2013.01); *G01R 33/093* (2013.01); *G01R 33/096* (2013.01); *G01R 33/098* (2013.01)

(58) Field of Classification Search
CPC ....... G01D 5/16; G01R 15/202; G01R 15/205
See application file for complete search history.

(56) References Cited

U.S. PATENT DOCUMENTS 8,063,632 B2 * 11/2011 Ausserlechner ... G01R 33/1215
324/252
9,739,812 B2 8/2017 Tsujimoto
9,810,551 B2 11/2017 Ausserlechner
(Continued)

FOREIGN PATENT DOCUMENTS

CN 104655004 A 5/2015
CN 105074488 A 11/2015
(Continued)

*Primary Examiner* — Alvaro E Fortich
(74) *Attorney, Agent, or Firm* — Harrity & Harrity, LLP (57) ABSTRACT

A sensor device comprises at least one test magnet which is designed to provide a magnetic test field, a first sensor element which is designed to capture a magnetic field and to provide a first sensor signal, wherein the first sensor signal comprises a first signal contribution on the basis of the magnetic test field, a second sensor element which is designed to capture a magnetic field and to provide a second sensor signal, wherein the second sensor signal comprises a second signal contribution on the basis of the magnetic test field, wherein the magnetic test field at the location of the first sensor element differs from the magnetic test field at the location of the second sensor element.

20 Claims, 5 Drawing Sheets

(56) References Cited

U.S. PATENT DOCUMENTS

| | | | |
|---|---|---|---|
| 2006/0202692 A1* | 9/2006 | Tatschl | G01L 25/00 257/E27.005 |
| 2012/0056615 A1* | 3/2012 | Ausserlechner | G01R 33/1207 324/202 |
| 2012/0274314 A1 | 11/2012 | Cesaretti et al. | |
| 2015/0028855 A1 | 1/2015 | Kim et al. | |
| 2015/0253157 A1 | 9/2015 | Granig | |
| 2016/0057510 A1* | 2/2016 | Hammerschmidt | H04Q 9/00 340/870.01 |
| 2016/0139199 A1 | 5/2016 | Petrie et al. | |
| 2016/0139230 A1 | 5/2016 | Petrie et al. | |
| 2017/0248445 A1* | 8/2017 | Ausserlechner | G01D 5/24442 |
| 2018/0292237 A1 | 10/2018 | Bilbao De Mendizabal | |
| 2020/0166325 A1 | 5/2020 | Ausserlechner et al. | |
| 2021/0364325 A1 | 11/2021 | Ausserlechner | |

FOREIGN PATENT DOCUMENTS

| | | |
|---|---|---|
| CN | 106405443 A | 2/2017 |
| CN | 107121057 A | 9/2017 |
| CN | 107869951 A | 4/2018 |
| CN | 108692743 A | 10/2018 |
| DE | 102009021085 A1 | 12/2009 |
| DE | 102009031281 A1 | 1/2010 |
| DE | 102015101635 A1 | 8/2015 |

* cited by examiner

SENSOR DEVICES WITH TEST MAGNETS, AND ASSOCIATED METHODS

CROSS REFERENCE TO RELATED APPLICATION

This application claims priority to German Patent Application No. 102019115373.5 filed on Jun. 6, 2019, the content of which is incorporated by reference herein in its entirety.

TECHNICAL FIELD

The present disclosure generally relates to sensor devices. For example, the disclosure relates to sensor devices with test magnets and to methods for operating such sensor devices.

BACKGROUND

Sensor elements of sensor devices are designed to capture physical signals and to convert them into electrical signals for further processing. With regard to reliable operation of a sensor device, its sensor elements are critical components. Sensor devices cannot function reliably if the feedback information provided by the sensor elements is already erroneous.

BRIEF DESCRIPTION

One aspect of the disclosure relates to a sensor device comprising at least one test magnet which is designed to provide a magnetic test field, a first sensor element which is designed to capture a magnetic field and to provide a first sensor signal, wherein the first sensor signal comprises a first signal contribution on the basis of the magnetic test field, a second sensor element which is designed to capture a magnetic field and to provide a second sensor signal, wherein the second sensor signal comprises a second signal contribution on the basis of the magnetic test field, wherein the magnetic test field at the location of the first sensor element differs from the magnetic test field at the location of the second sensor element.

A further aspect of the disclosure relates to a method comprising: providing a magnetic test field, providing a first sensor signal using a first sensor element, wherein the first sensor signal comprises a first signal contribution on the basis of the magnetic test field, providing a second sensor signal using a second sensor element, wherein the second sensor signal comprises a second signal contribution on the basis of the magnetic test field, wherein the magnetic test field at the location of the first sensor element differs from the magnetic test field at the location of the second sensor element.

BRIEF DESCRIPTION OF THE DRAWINGS

Sensor devices and associated methods according to the disclosure are explained in more detail below on the basis of drawings. The elements shown in the drawings are not necessarily represented in a manner true to scale relative to one another. Identical reference signs can denote identical components.

DETAILED DESCRIPTION

Figure 1:
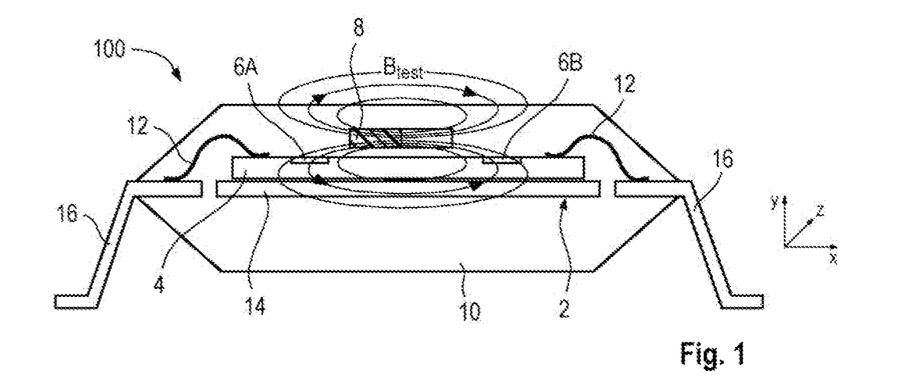
FIG. 1 schematically shows a cross-sectional view of a sensor device 100 according to the disclosure.

FIG. 1 schematically shows a cross-sectional view of a sensor device 100 according to the disclosure. The sensor device 100 is illustrated in a general manner in order to qualitatively describe aspects of the disclosure. The sensor device 100 may have further aspects which are not illustrated in FIG. 1 for the sake of simplicity. For example, the sensor device 100 can be expanded by any desired aspects which are described in connection with other sensor devices according to the disclosure. Example operation of the sensor device 100 is described in connection with FIG. 2.

The sensor device 100 may have a chip carrier 2 and a sensor chip 4 arranged on the chip carrier 2. A first sensor element 6A and a second sensor element 6B can be integrated in the sensor chip 4. A test magnet 8 may be arranged above the sensor chip 4, which test magnet is designed to provide a magnetic test field $B_{test}$. The test magnet 8 may be fastened, for example, to the top side of the sensor chip 4, for example using an adhesive. One or more components of the sensor device 100 may be at least partially encapsulated by an encapsulation material 10.

The first sensor element 6A may be designed to capture a magnetic field and to provide a first sensor signal on the basis of the captured magnetic field. In this case, the first sensor signal comprises a first signal contribution on the basis of the magnetic test field $B_{test}$. In the example in FIG. 1, the sensor device 100 is not exposed to a further, external magnetic field, with the result that the first sensor signal can correspond to the first signal contribution. If the sensor device 100 is exposed to an additional, external magnetic field, the first sensor signal may comprise a further signal contribution on the basis of the external magnetic field. In a similar manner to the first sensor element 6A, the second sensor element 6B may be designed to capture a magnetic field and to provide a second sensor signal on the basis of the captured magnetic field.

The sensor elements 6A and 6B may be, for example, magnetoresistive xMR sensor elements, in particular AMR sensor elements, GMR sensor elements or TMR sensor elements. Alternatively, the sensor elements 6A and 6B may be corresponding Hall sensor elements. The first sensor element 6A and the second sensor element 6B may have substantially the same sensor characteristic. If the sensor elements 6A and 6B are exposed to an identical magnetic field, voltage values output by the sensor elements 6A and 6B may be substantially identical. In a further example, the sensor elements 6A and 6B may have different sensor characteristics. For example, one of the sensor elements 6A and 6B may have a higher sensitivity than the other sensor element.

The first sensor element 6A and the second sensor element 6B may each be designed to capture an absolute magnetic field strength of a magnetic field. In this case, the respective sensor element can capture both the absolute value of the captured magnetic field and the sign, that is to say the direction, of the magnetic field. In this case, the absolute magnetic field strength can be captured in at least one sensitivity direction or in one sensitivity plane of the respective sensor element. The first sensor element 6A and the second sensor element 6B may be sensitive, in particular, in an identical first magnetic field direction or first magnetic field plane. For example, the sensor elements 6A and 6B may each be sensitive in the x, y or z direction, that is to say may be designed to capture a magnetic field component in the x, y or z direction.

The sensor device 100 may be designed to operate as a dual-channel magnetic field sensor, wherein the sensor elements 6A and 6B may be redundant. For example, the sensor device 100 may be designed to operate as a position sensor or a magnetic current sensor. The sensor device 100 may be a linear magnetic field sensor, in particular.

In the example in FIG. 1, the test magnet 8 may be arranged in the x-z plane and may be magnetized in the x direction. The magnetic field of the test magnet 8 is represented by magnetic field lines. The north pole of the test magnet 8 (cf. hatched region) may therefore be on the left and the south pole of the test magnet 8 may be on the right in the example in FIG. 1. In a further example, the poles of the test magnet 8 may be swapped. The maximum absolute magnetic field strength of the magnetic test field $B_{test}$ can depend on the measurement ranges of the sensor elements 6A and 6B. In particular, the maximum absolute magnetic field strength of the magnetic test field $B_{test}$ may be in a range of approximately 1% to approximately 10% of the upper limit of the measurement range of the first sensor element 6A or of the second sensor element 6B. The measurement ranges of the sensor elements 6A and 6B may be in a range of approximately 50 μT to approximately 500 mT or of approximately 50 μT to approximately 300 mT or of approximately 50 μT to approximately 100 mT.

The magnetic test field $B_{test}$ may have a first magnetic field strength at the location of the first sensor element 6A in the sensitive direction or sensitive plane and may have a second magnetic field strength at the location of the second sensor element 6B in the sensitive direction or sensitive plane, wherein the first magnetic field strength and the second magnetic field strength differ from one another. In the example in FIG. 1, the test magnet 8 can be arranged between the sensor elements 6A and 6B in such a manner that the first magnetic field strength and the second magnetic field strength have an identical absolute value and different signs.

The chip carrier 2 may be produced, for example, from copper, nickel, aluminum or stainless steel. In the example in FIG. 1, the chip carrier 2 may be a leadframe having a die pad 14 and one or more connection conductors 16. The sensor chip 4 may be electrically connected to one or more of the connection conductors 16 via bonding wires 12. The connection conductors 16 may at least partially protrude from the encapsulation material 10, with the result that electrical contact can be made with the sensor chip 4 from outside the first encapsulation material 10. In particular, sensor signals provided by the sensor elements 6A and 6B can be provided by the connection conductors 16 protruding from the encapsulation material 10.

The encapsulation material 10 may at least partially encapsulate one or more of the components of the sensor device 100. The sensor device 100 in FIG. 1 can also be referred to as a sensor package. In the example in FIG. 1, the die pad 14, the sensor chip 4 and the test magnet 8 may be completely encapsulated, whereas the connection conductors 16 can partially protrude from the encapsulation material 10. The encapsulation material may be produced, for example, from an epoxy resin, a thermoplastic or a thermosetting polymer.

Figure 2:
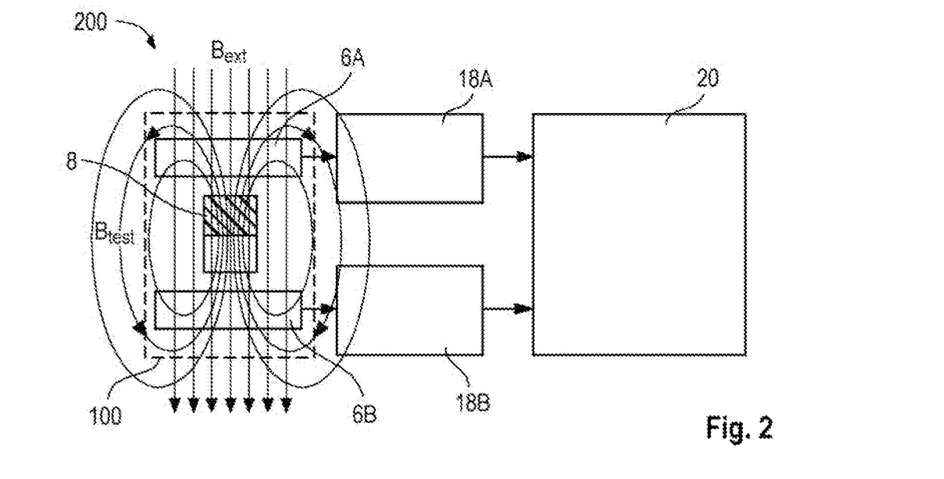
FIG. 2 shows a block diagram of a sensor system 200 according to the disclosure.

FIG. 2 schematically shows a block diagram of a sensor system 200 according to the disclosure. The sensor system 200 may have components which have already been described in connection with FIG. 1, with the result that statements made with respect to FIG. 1 may also apply to FIG. 2.

The sensor system 200 may contain a sensor device 100. In a similar manner to FIG. 1, the sensor device 100 may have a first sensor element 6A, a second sensor element 6B and a test magnet 8 which provides a magnetic test field $B_{test}$. In the example in FIG. 2, the components which are enclosed by a dashed line may correspond to the sensor device 100 in FIG. 1. In further examples, the sensor system 200 can be operated with other sensor devices according to the disclosure.

The sensor system 200 may have a reading channel 18A electrically coupled to the first sensor element 6A and a reading channel 18B electrically coupled to the second sensor element 6B. The reading channels 18A and 18B may be designed to read sensor signals provided by the respective sensor element. The sensor system 200 may also have an evaluation unit 20 which is electrically coupled to the reading channels 18A and 18B and is designed to receive and evaluate sensor signals which have been read.

The evaluation unit 20 may be designed to form a comparison value from the first sensor signal and the second sensor signal and to check whether the comparison value is within a predefined range of values. The evaluation unit 20 may also be designed to indicate unreliable operation of at least one of the first sensor element 6A or the second sensor element 6B if the comparison value is outside the predefined range of values. In one example, the evaluation unit 20 may be part of the sensor device 100 and may be at least partially encapsulated by the encapsulation material 10. In a further example, the function of the evaluation unit 20 may be performed by a microcontroller (not shown) which may be arranged outside the sensor device 100.

Example operation of the sensor system 200 is described below with reference to FIGS. 1 and 2. The sensor device 100 may be exposed to an external magnetic field $B_{ext}$. In the example in FIG. 2, it can be seen from the magnetic field lines of the magnetic field $B_{ext}$ that the magnetic field $B_{ext}$ may be, in particular, a constant external magnetic field. The sensor elements 6A and 6B of the sensor device 100 are therefore exposed to the external magnetic field $B_{ext}$ and to the magnetic test field $B_{test}$. A signal $S_1$ provided by the first sensor element 6A contains a signal contribution $S_{1,test}$ on the basis of the magnetic test field $B_{test}$ and a signal contribution $S_{1,ext}$ on the basis of the external magnetic field $B_{ext}$. In this case, the signal contribution $S_{1,test}$ corresponds to the magnetic field strength of the magnetic test field $B_{test}$ in the sensitive direction or sensitive plane of the first sensor element 6A. Depending on the direction of the magnetic test field at the location of the first sensor element 6A, the signal contribution $S_{1,test}$ may have a positive or negative sign. In a similar manner the signal $S_2$ provided by the second sensor element 6B contains a signal contribution $S_{2,test}$ on the basis of the magnetic test field $B_{test}$ and a signal contribution $S_{2,ext}$ on the basis of the external magnetic field $B_{ext}$. In this case, the signal contribution $S_{2,test}$ corresponds to the magnetic field strength of the magnetic test field $B_{test}$ in the sensitive direction or sensitive plane of the second sensor element 6B. In the example in FIG. 2, the sensitive directions or planes of the sensor elements 6A and 6B may be identical. As already discussed in connection with FIG. 1, the test magnet 8 may be arranged in the sensor device 100, in particular, in such a manner that $S_{1,test} = -S_{2,test}$. For example, the signal contribution $S_{1,test}$ may therefore represent a value of +1 mT and the signal contribution $S_{2,test}$ may represent a value of −1 mT.

The first and second sensor signals may be read by the reading channels 18A and 18B and forwarded to the evaluation unit 20. The evaluation unit 20 can form a comparison value from the first sensor signal $S_1$ and the second sensor signal $S_2$. In particular, the evaluation unit 20 can form an absolute value difference from the two sensor signals, that is to say $|S_1-S_2|$. Since the external magnetic field $B_{ext}$ is assumed to be constant, the absolute value difference may be independent of the external magnetic field $B_{ext}$ present. An absolute value difference of $|2 \cdot S_{1,test}|$ or $|2 \cdot S_{2,test}|$ results. The value of the absolute value difference is denoted using $2 \cdot S_{test}$ below for the sake of simplicity.

If the absolute value difference formed by the evaluation unit 20 has a value of (substantially) $2 \cdot S_{test}$, reliable operation of the sensor device 100 can be assumed. A test criterion for the reliable operation of the sensor device 100 can therefore be the following for the example in FIGS. 1 and 2:

$$|S_1-S_2| \in [2 \cdot S_{test}-\varepsilon, \ 2 \cdot S_{test}+\varepsilon], \tag{1}$$

where $\varepsilon$ is a predetermined tolerance value.

The evaluation unit 20 can check whether the comparison value $|S_1-S_2|$ is within the above-mentioned predetermined range of values. In this case, the range of values is based on the known value $S_{test}$ of the magnetic test field at the location of the sensor elements 6A and 6B in their sensitive direction or sensitive plane. If the comparison value is outside the predefined range of values, the evaluation unit 20 can indicate unreliable operation of the sensor device 100. Since the described check is based on the signals from both sensor elements 6A and 6B, both unreliable operation of the first sensor element 6A and unreliable operation of the second sensor element 6B can be detected by the check.

In the case of a sensor device without a test magnet (that is to say $S_{test}=0$), a test criterion for the reliable operation of this sensor device may be: $S_1-S_2 \in [-\varepsilon, +\varepsilon]$. However, such a test criterion would detect only whether the sensor elements of the sensor device are functioning in the same manner, that is to say whether they capture identical values of a magnetic field which is present. In contrast to this, the above test criterion (1) can be used to additionally check whether one or both of the sensor elements 6A and 6B are operating unreliably on account of a cause to which they are both exposed. Example causes of unreliable operation of the sensor elements may be, inter alia: general mechanical tensions which can change the sensitivity of Hall plates of the sensor elements; saturation caused by stray fields; influence of biasing structures, for example pinned xMR layers; low sensor supply; conventional aging processes.

Since the test criterion (1) is based on the sensor signals from both sensor elements 6A and 6B, it can be considered to be a measure of the absolute accuracy of the sensor device 100. The magnetic test field $B_{test}$ should generally be selected in such a manner that it is different at the locations of the sensor elements with respect to the sensitivity direction or sensitivity plane of the sensor elements. For the test criterion (1), this results in a range of values which depends on the known values of the magnetic test field $B_{test}$ at the locations of the sensor elements. In the examples in FIGS. 1 and 2, the test magnet 8 was positioned in such a manner that $S_{1,test}=-S_{2,test}$. In further examples, the following can more generally apply: $S_{1,test} \neq S_{2,test}$. In particular, the test criterion (1) can be generalized as:

$$|S_1-S_2| \in [a \cdot S_{test}-\varepsilon, \ a \cdot S_{test}+\varepsilon], \tag{2}$$

where a can be a scaling factor in the range of approximately 0 to approximately 2. In this case, the scaling factor a may result, in particular, from the position of the test magnet 8 with respect to the first sensor element 6A and with respect to the second sensor element 6B.

The output signals from the first sensor element 6A and from the second sensor element 6B may each be temperature-dependent. For example, the sensor signals output by the first sensor element 6A may differ for different temperatures with the same magnetic field. Furthermore, the magnetic properties of the test magnet 8 and therefore the magnetic test field provided by the test magnet 8 may depend on the temperature. The evaluation unit 20 may be designed to carry out a temperature compensation for a predefined range of values, with the result that temperature dependences of the first sensor element 6A, of the second sensor element 6B and/or of the magnetic properties of the test magnet 8 are largely corrected. The information used for such a correction can be provided by a calibration process which is carried out in advance.

The sensor device 100 can first of all be produced and a comparison value can then be determined from the sensor signals from the sensor elements 6A and 6B. On the basis of the determined comparison value, the evaluation unit 20 can be adjusted or programmed in such a manner that it checks one of the test criteria (1) and (2). If unreliable operation of the first sensor element 6A and/or of the second sensor element 6B occurs over time, this can be verified and indicated by the evaluation unit 20 using the method described above.

FIGS. 3 to 16 schematically show cross-sectional views of sensor devices 300 to 1600 according to the disclosure. The sensor devices 300 to 1600 may each be at least partially similar to the sensor device 100 in FIG. 1, with the result that statements made with respect to FIG. 1 can also apply to any of FIGS. 3 to 16. Each of the sensor devices 300 to 1600 may be used in the sensor system 200 in FIG. 2.

Figure 3:
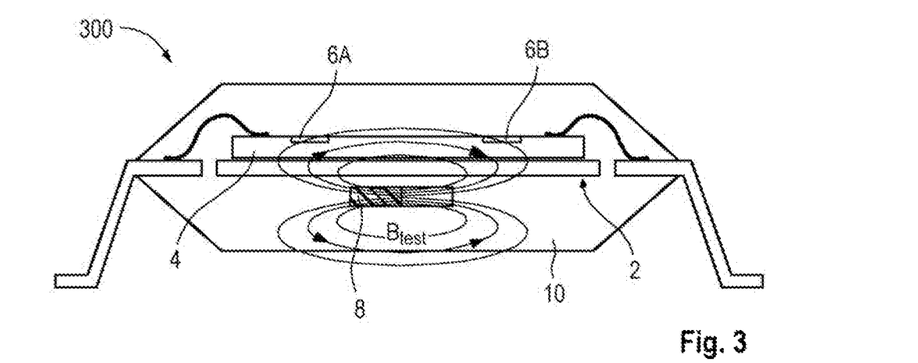
FIG. 3 schematically shows a cross-sectional view of a sensor device 300 according to the disclosure.

In the example in FIG. 3, the test magnet 8 and the sensor chip 4 may be arranged on opposite surfaces of the chip carrier 2. For example, the test magnet 8 may be a permanent magnet which may be fastened to the underside of the die pad 14, for example using an adhesive. In a similar manner to FIG. 1, the test magnet 8 may be arranged, in particular, in such a manner that $S_{1,test}=-S_{2,test}$.

Figure 4:
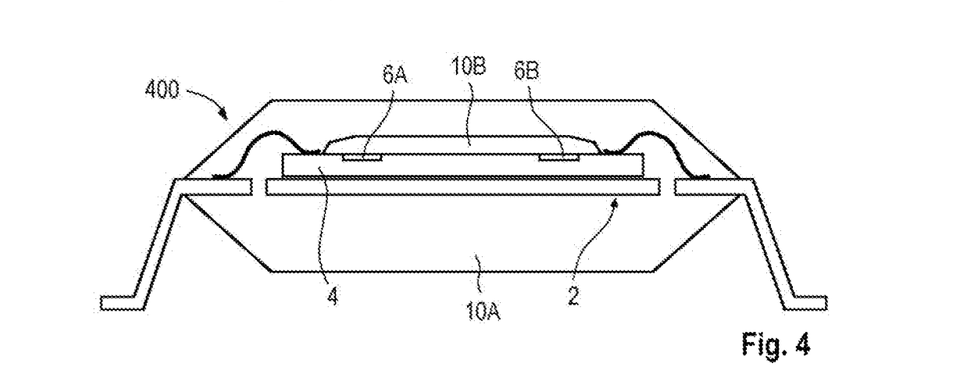
FIG. 4 schematically shows a cross-sectional view of a sensor device 400 according to the disclosure.

In the example in FIG. 4, a magnetic test field can be generated by a further encapsulation material 10B. The further encapsulation material 10B may be arranged, for example, on the top side of the sensor chip 4 and may at least partially cover one or both of the sensor elements 6A and 6B in this case. For the sake of simplicity, the field lines of the magnetic test field are not illustrated in FIG. 4. The field lines may have, for example, a similar profile to the field lines of the test magnet 8 in FIG. 1. In other words, the further encapsulation material 10B may be equivalent to the permanent magnet in FIG. 1 with regard to the magnetic test field generated. In a similar manner, the permanent magnets shown in the further examples described herein can also be replaced with a magnetized encapsulation material.

In one example, the further encapsulation material 10B may be a magnetized glob-top material. In a further example, the further magnetized encapsulation material 10B may be produced, for example, from an epoxy resin, a thermoplastic or a thermosetting polymer. The further encapsulation material 10B may differ from the encapsulation material 10A or may be identical to the latter. In the latter case, the further encapsulation material 10B may correspond to a magnetized region of the encapsulation material 10A. The further encapsulation material 10B can be magnetized, for example, by adding magnetizable particles. The magnetizable particles may be added to the further encapsulation material 10B, with the result that the latter can be magnetized after the encapsulation step. For example, a ferrite or NdFeB can be added to the further encapsulation material 10B. The further encapsulation material 10B may be magnetized over its entire volume or only at selected locations. The magnetized regions of the further encapsulation material 10B may each be magnetized in a homogeneous or inhomogeneous manner. The magnetization of the further encapsulation material 10B can be selected, in particular, according to the properties of the desired magnetic test field.

Figure 5:
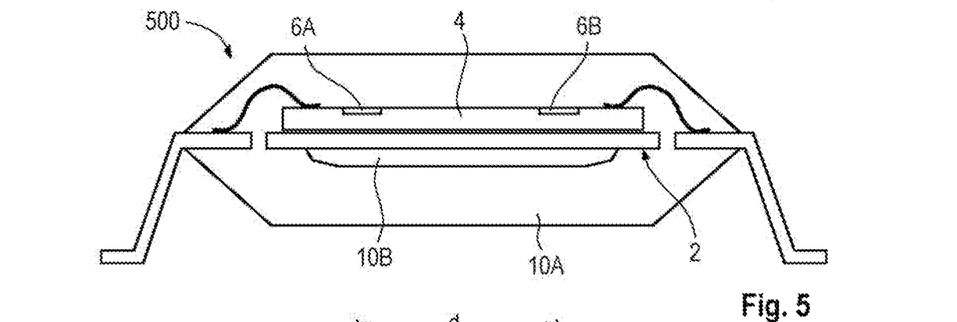
FIG. 5 schematically shows a cross-sectional view of a sensor device 500 according to the disclosure.

The sensor device 500 in FIG. 5 may be similar to the sensor device 400 in FIG. 4. In contrast to FIG. 4, the further encapsulation material 10B in FIG. 5 may be arranged on the underside of the metal carrier/bonding wires 12. For the sake of simplicity, the field lines of the magnetic test field are not illustrated in FIG. 5. The field lines may have, for example, a similar profile to the field lines of the test magnet 8 in FIG. 3.

Figure 6:
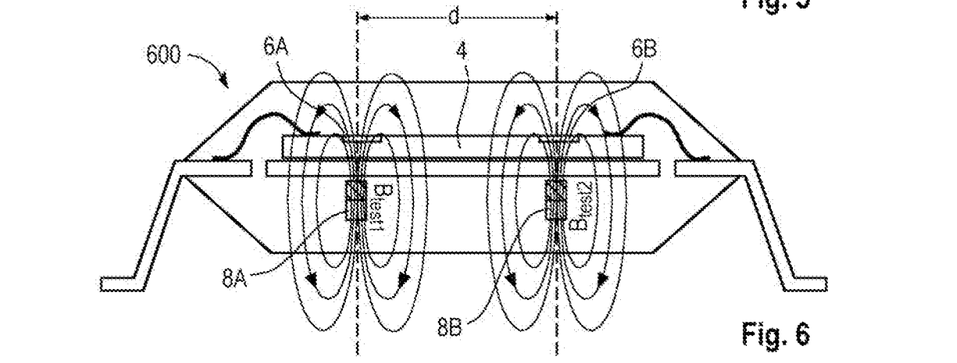
FIG. 6 schematically shows a cross-sectional view of a sensor device 600 according to the disclosure.

In the example in FIG. 6, a first magnetic test field $B_{test1}$ can be generated by a first test magnet 8A and a second magnetic test field $B_{test2}$ can be generated by a second test magnet 8B. The first test magnet 8A can be designed to generate a defined magnetic field at the location of the first sensor element 6A. The first test magnet 8A may be arranged, in particular, in the immediate vicinity of or beside the first sensor element 6A. In a similar manner, the second test magnet 8B can be arranged beside the second sensor element 6B in order to provide a defined magnetic field at the location of the latter. Such discrete test magnets arranged beside the respective sensor element can be used, in particular, in the case of a large distance "d" between the sensor elements 6A and 6B. In the example in FIG. 6, the test magnets 8A and 8B are each oriented in a vertical direction and have opposite magnetization directions. In a special example, the strengths and the positioning of the test magnets 8A and 8B can be selected in such a manner that $S_{1,test}=-S_{2,test}$. The vertical orientation of the magnetic test fields can be used, in particular, in sensor devices having Hall sensor elements.

Figure 7:
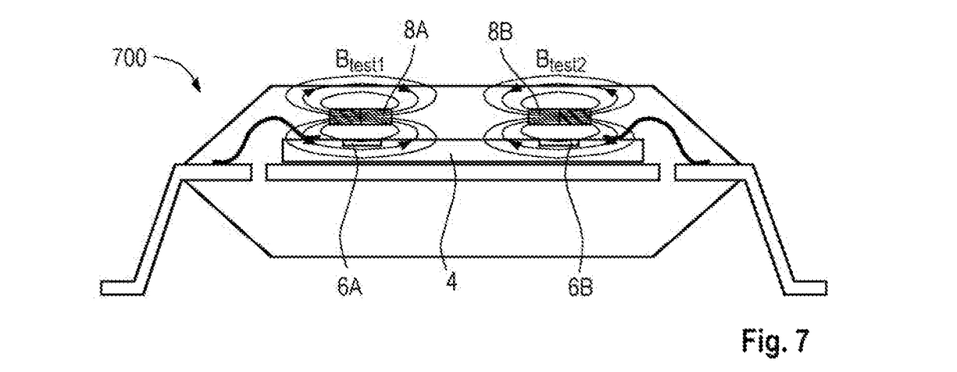
FIG. 7 schematically shows a cross-sectional view of a sensor device 700 according to the disclosure.

The sensor device 700 in FIG. 7 may be similar to the sensor device 600 in FIG. 6. In contrast to FIG. 6, the test magnets 8A and 8B in FIG. 7 may be horizontally oriented. It can be seen from the field lines that the magnetizations of the test magnets 8A and 8B may be opposite. The horizontal orientation of the magnetic test fields can be used, in particular, in sensor devices having magnetoresistive sensor elements.

Figure 8:
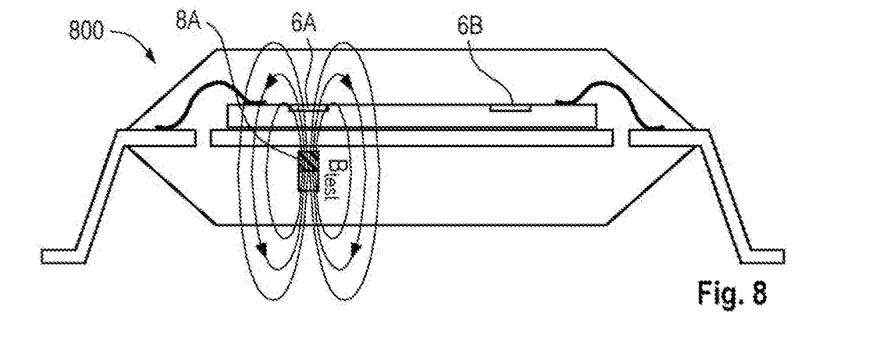
FIG. 8 schematically shows a cross-sectional view of a sensor device 800 according to the disclosure.

The sensor device 800 in FIG. 8 may be similar to the sensor device 600 in FIG. 6. In contrast to FIG. 6, the sensor device 800 has only one test magnet 8A beside the first sensor element 6A. In the example in FIG. 8, the test magnet 8A is vertically oriented. Even in the case of such an asymmetrical arrangement, different values of the magnetic test field $B_{test}$ can be provided at the locations of the sensor elements 6A and 6B. This makes it possible to again provide a defined and known offset between the first magnetic field strength captured by the first sensor element 6A and the second magnetic field strength captured by the second sensor element 6B.

Figure 9:
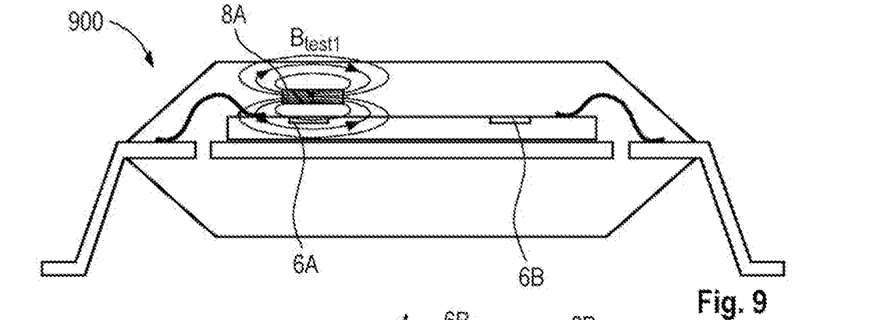
FIG. 9 schematically shows a cross-sectional view of a sensor device 900 according to the disclosure.

The sensor device 900 in FIG. 9 may be similar to the sensor device 800 in FIG. 8. In contrast to FIG. 8, the test magnet 8A in FIG. 9 may be horizontally oriented.

Figure 10:
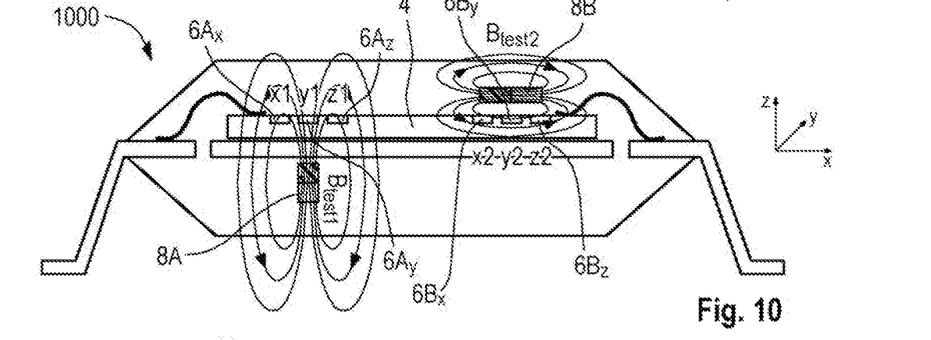
FIG. 10 schematically shows a cross-sectional view of a sensor device 1000 according to the disclosure.

In contrast to the examples above, the sensor device 1000 in FIG. 10 may have further sensor elements. Three sensor elements $6A_x$, $6A_y$, and $6A_z$ may be arranged on the left-hand side of the sensor chip 4. Furthermore, a first test magnet 8A which may be vertically oriented may be placed beside these sensor elements. The sensor element $6A_x$ may be designed to capture a magnetic field in the x direction and to provide a sensor signal which comprises a signal contribution on the basis of the magnetic test field $B_{test1}$ of the first test magnet 8A. In a similar manner, the sensor elements $6A_y$ and $6A_z$ may be sensitive in the y and z directions and may provide corresponding sensor signals. Three sensor elements $6B_x$, $6B_y$ and $6B_z$ may likewise be arranged on the right-hand side of the sensor chip 4. Furthermore, a second test magnet 8B which may be horizontally oriented may be placed beside these sensor elements. The sensor element $6B_x$ may be designed to capture a magnetic field in the x direction and to provide a sensor signal which comprises a signal contribution on the basis of the magnetic test field $B_{test2}$ of the second test magnet 8B. In a similar manner, the sensor elements $6B_y$ and $6B_z$ may be sensitive in the y and z directions and may provide corresponding sensor signals. The arrangement of the sensor elements which is shown in FIG. 10 is merely example. For example, the arrangement of the sensor elements $6A_x$, $6A_y$ and $6A_z$ or the arrangement of the sensor elements $6B_x$, $6B_y$ and $6B_z$ may be swapped with one another. Furthermore, the arrangement of the test magnets 8A and 8B is example. In a further example, the first test magnet 8A may be horizontally oriented and the second test magnet 8B may be vertically oriented. In yet another example, both test magnets 8A and 8B may be horizontally or vertically oriented.

As already described in connection with FIG. 2, the sensor signals generated by the sensor elements can be forwarded to the evaluation unit 20. A plurality of comparison values can be formed in the evaluation unit 20. In this case, each of the comparison values can be formed from the sensor signals generated by the sensor elements which are sensitive in an identical magnetic field direction. For example, a first comparison value can be formed from the sensor signals from the sensor elements $6A_x$ and $6B_x$, in particular an absolute value difference, as described in connection with FIG. 2. In a similar manner, a second comparison value can be formed from the sensor signals from the sensor elements $6A_y$ and $6B_y$ and a third comparison value can be formed from the sensor signals from the sensor elements $6A_z$ and $6B_z$. For each of the comparison values, the evaluation unit 20 can check whether the respective comparison value is in an associated range of values. The check described in connection with FIG. 2 can therefore be carried out for each sensitivity direction x, y and z. In other words, it is possible to check, for each of these directions, whether or not there is reliable operation of the corresponding sensor elements of the sensor device 1000. The sensor device 1000 may be a 3-D magnetic sensor. It goes without saying that a 2-D magnetic sensor can be implemented in a similar manner.

Figure 11:
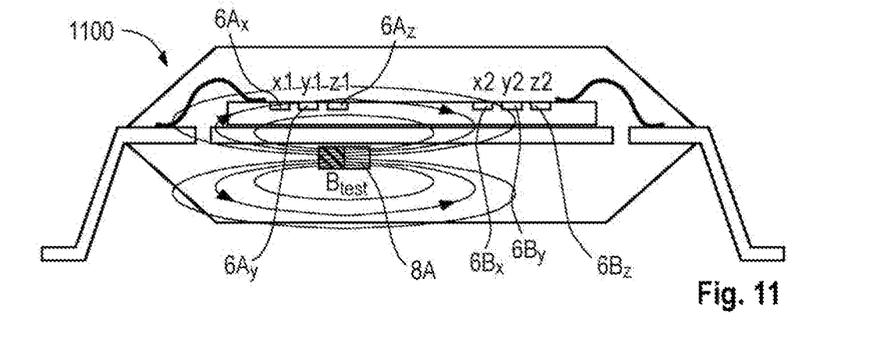
FIG. 11 schematically shows a cross-sectional view of a sensor device 1100 according to the disclosure.

The sensor device 1100 in FIG. 11 may be similar to the sensor device 1000 in FIG. 10. In contrast to FIG. 10, the sensor device 1100 may have only one test magnet 8A in the vicinity of the sensor elements $6A_x$, $6A_y$ and $6A_z$ arranged on the left. The individual test magnet 8A can respectively generate a different magnetic test field at the locations of the sensor elements with an identical sensitivity direction.

Figure 12:
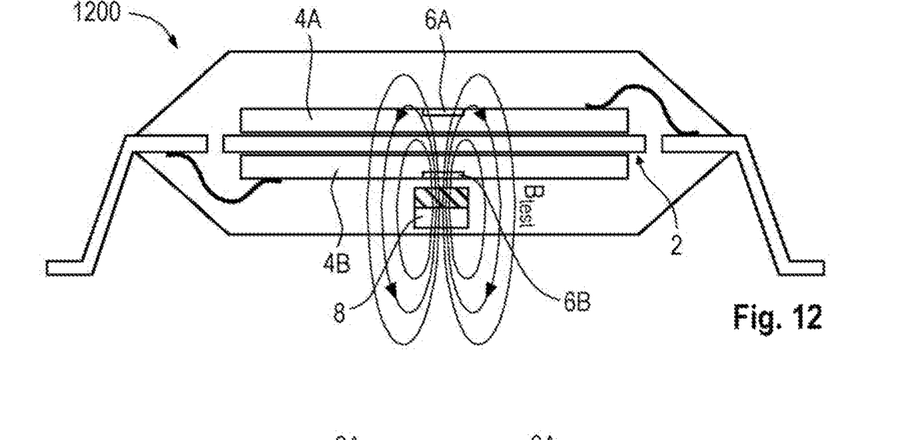
FIG. 12 schematically shows a cross-sectional view of a sensor device 1200 according to the disclosure.

The sensor device 1200 in FIG. 12 may have a first sensor chip 4A with a first sensor element 6A and a second sensor chip 4B with a second sensor element 6B. In the example in FIG. 12, the two sensor chips 4A and 4B may be arranged on opposite sides of the chip carrier 2. A magnetic test field $B_{test}$ can be generated by a vertically oriented test magnet 8 arranged under the second sensor chip 4B. The sensor chips 4A and 4B may be identical, in particular, and may be arranged in a manner rotated through 180° relative to one another. This makes it possible to invert the sensitive directions of the sensor elements 6A and 6B relative to one another. In a further example, the sensor device 1200 may have a second test magnet (not shown) which may be arranged above the first sensor chip 4A. In this case, the second test magnet may be likewise vertically oriented and may have a magnetization direction which may be opposite the magnetization direction of the first test magnet 8.

Figure 13:
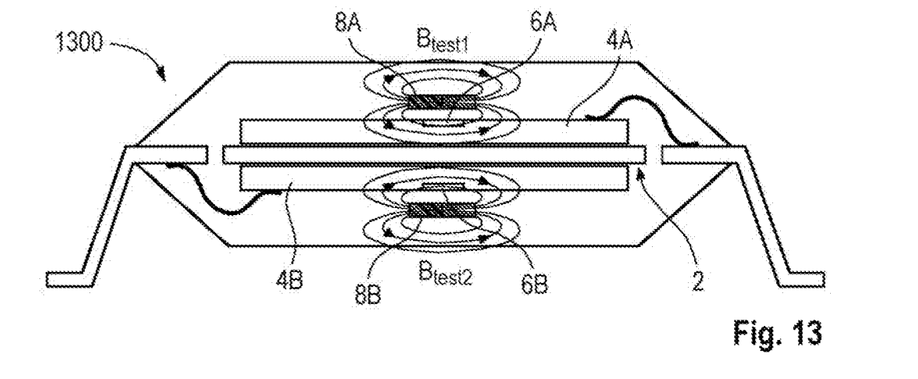
FIG. 13 schematically shows a cross-sectional view of a sensor device 1300 according to the disclosure.

The sensor device 1300 in FIG. 13 may be similar to the sensor device 1200 in FIG. 12. In contrast to FIG. 12, the sensor device 1300 has two test magnets 8A and 8B which may both be horizontally oriented. The first test magnet 8A may be arranged above the first sensor element 6A and the second test magnet 8B may be arranged below the second sensor element 6B.

Figure 14:
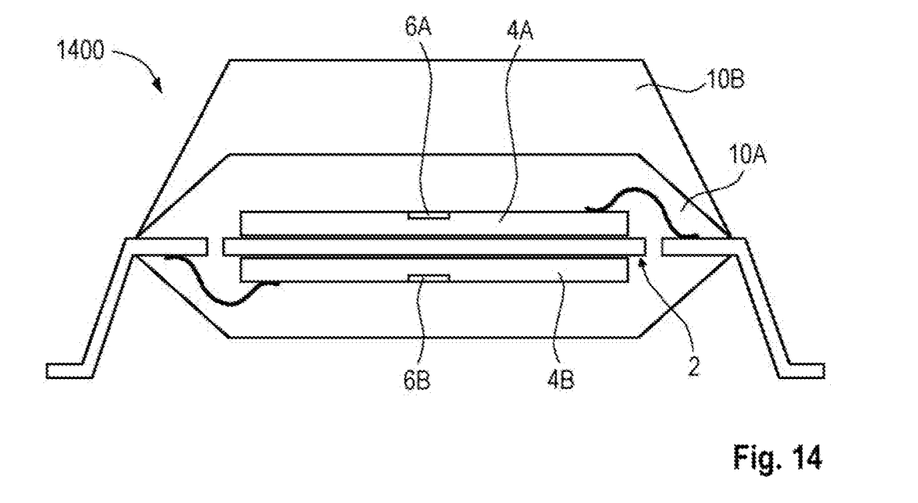
FIG. 14 schematically shows a cross-sectional view of a sensor device 1400 according to the disclosure.

The sensor device 1400 in FIG. 14 may be similar to the sensor devices in FIGS. 12 and 13 in terms of the arrangement of its sensor chips 4A and 4B and the associated sensor elements 6A and 6B. In the example in FIG. 14, the sensor device 1400 may have a first, non-magnetic encapsulation material 10A and a second, magnetized encapsulation material 10B. In this case, the second encapsulation material 10B may be arranged, for example, on the top side of the first encapsulation material 10A. The first and second encapsulation materials 10A and 10B may each be produced using at least one of the following techniques: compression molding, injection molding, powder molding, liquid molding, etc. The second, magnetized encapsulation material 10B may be produced, for example, from an epoxy resin, a thermoplastic or a thermosetting polymer. The second encapsulation material 10B can be magnetized, for example, by adding magnetizable particles, for example a ferrite or NdFeB. The second, magnetized encapsulation material 10B can provide a magnetic test field. For the sake of simplicity, the field lines of the magnetic test field are not illustrated in FIG. 14.

The field lines may have, for example, a similar profile to the field lines of a vertically or horizontally oriented permanent magnet, as described in connection with the examples above.

The sensor device 1500 exhibits a structure which differs from the examples above. A sensor chip 4 may be mounted on a chip carrier 2 and may be electrically connected to the latter via one or more bonding wires 12. For the sake of simplicity, the sensor elements of the sensor chip 4 are not shown in FIG. 15. The chip carrier 2 and the sensor chip 4 may be at least partially encapsulated by a first encapsulation material 10A, wherein the chip carrier 2 or one or more connection conductors of the chip carrier 2 may protrude from the first encapsulation material 10A. In the example in FIG. 15, the sensor device 1500 may optionally have an integrated capacitor 22 which is encapsulated in an encapsulation material and may be designed to provide improved EMC ("electromagnetic compatibility") or improved ESD ("electrostatic discharge") protection. The sensor device 1500 may also have a second, magnetized encapsulation material 10B. The second encapsulation material 10B may be magnetized in the vertical direction.

Figure 15:
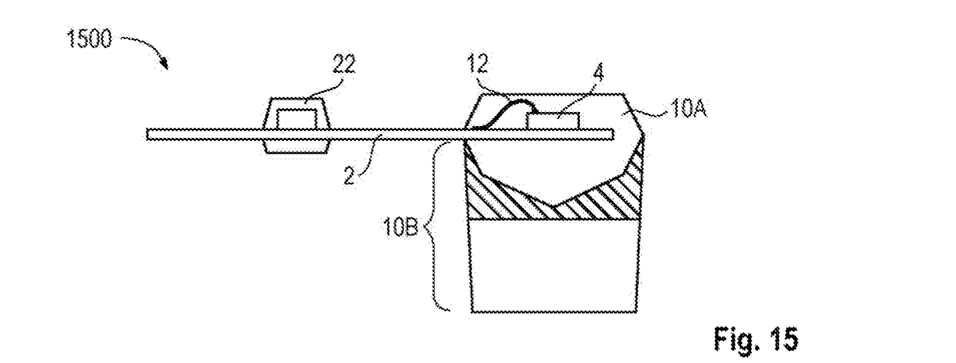
FIG. 15 schematically shows a cross-sectional view of a sensor device 1500 according to the disclosure.
Figure 16:
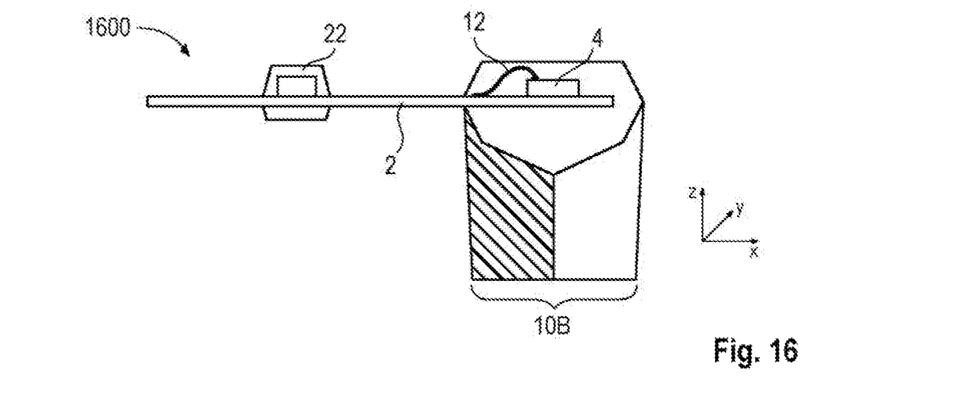
FIG. 16 schematically shows a cross-sectional view of a sensor device 1600 according to the disclosure.

The sensor device 1600 in FIG. 16 may be similar to the sensor device 1500 in FIG. 15. In contrast to FIG. 15, the second, magnetized encapsulation material 10B can have a magnetization in the horizontal direction.

Figure 17:
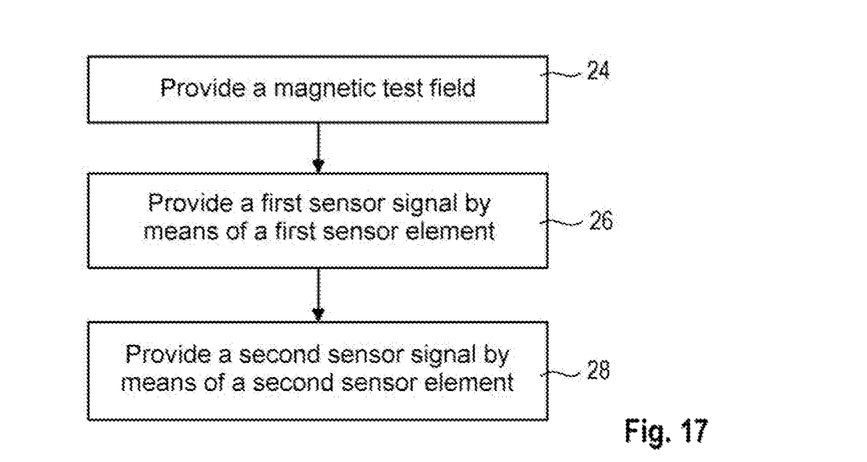
FIG. 17 shows a flowchart of a method according to the disclosure.

FIG. 17 illustrates a flowchart of a method according to the disclosure. For example, each of the sensor devices described herein can be operated according to the method in FIG. 17.

A magnetic test field $B_{test}$ is provided at 24. A first sensor signal is provided by a first sensor element 6A at 26, wherein the first sensor signal comprises a first signal contribution on the basis of the magnetic test field $B_{test}$. A second sensor signal is provided by a second sensor element 6B at 28, wherein the second sensor signal comprises a second signal contribution on the basis of the magnetic test field $B_{test}$. The magnetic test field $B_{test}$ at the location of the first sensor element 6A differs from the magnetic test field $B_{test}$ at the location of the second sensor element 6B.

EXAMPLES

Sensor devices and associated methods are explained below on the basis of examples.

Example 1 is a sensor device comprising: at least one test magnet which is designed to provide a magnetic test field; a first sensor element which is designed to capture a magnetic field and to provide a first sensor signal, wherein the first sensor signal comprises a first signal contribution on the basis of the magnetic test field; a second sensor element which is designed to capture a magnetic field and to provide a second sensor signal, wherein the second sensor signal comprises a second signal contribution on the basis of the magnetic test field, wherein the magnetic test field at the location of the first sensor element differs from the magnetic test field at the location of the second sensor element.

Example 2 is a sensor device according to example 1, also comprising: an evaluation unit which is designed to form a comparison value from the first sensor signal and the second sensor signal and to check whether the comparison value is within a predefined range of values, wherein the range of values is based on the magnetic test field.

Example 3 is a sensor device according to example 2, wherein the evaluation unit is designed to indicate unreliable operation of at least one of the first sensor element or the second sensor element if the comparison value is outside the predefined range of values.

Example 4 is a sensor device according to one of the preceding examples, wherein the first sensor element and the second sensor element are each designed to capture an absolute magnetic field strength of a magnetic field.

Example 5 is a sensor device according to one of the preceding examples, wherein the first sensor element and the second sensor element are sensitive in an identical first magnetic field direction or first magnetic field plane.

Example 6 is a sensor device according to example 5, wherein the magnetic test field has a first magnetic field strength at the location of the first sensor element in the first sensitive direction or the first sensitive plane and has a second magnetic field strength at the location of the second sensor element in the first sensitive direction or the first sensitive plane, wherein the first magnetic field strength and the second magnetic field strength differ from one another.

Example 7 is a sensor device according to example 6, wherein the first magnetic field strength and the second magnetic field strength have an identical absolute value and different signs.

Example 8 is a sensor device according to example 6 or 7, wherein the evaluation unit is designed to form an absolute value difference from the first magnetic field strength and the second magnetic field strength and to check whether the absolute value difference is in a range [$a \cdot B_{test} - \varepsilon$; $a \cdot B_{test} + \varepsilon$], where $B_{test}$ is the absolute value of the first magnetic field strength and of the second magnetic field strength, where $\varepsilon$ is a predetermined tolerance value, where a is a scaling factor in the range of 0 to 2, wherein a results from the position of the at least one test magnet with respect to the first sensor element and with respect to the second sensor element.

Example 9 is a sensor device according to one of the preceding examples, also comprising: an encapsulation material, wherein the first sensor element and the second sensor element are at least partially encapsulated by the encapsulation material.

Example 10 is a sensor device according to example 9, wherein the encapsulation material is at least partially magnetized and forms at least one part of the at least one test magnet.

Example 11 is a sensor device according to one of the preceding examples, wherein the at least one test magnet comprises at least one permanent magnet.

Example 12 is a sensor device according to one of the preceding examples, wherein the at least one test magnet comprises a first test magnet and a second test magnet, wherein the first test magnet is arranged beside the first sensor element and the second test magnet is arranged beside the second sensor element.

Example 13 is a sensor device according to one of the preceding examples, wherein the first sensor element and the second sensor element have substantially the same sensor characteristic.

Example 14 is a sensor device according to one of examples 2 to 13, wherein the evaluation unit is designed to carry out a temperature compensation for a predefined range of values, with the result that temperature dependences of the first sensor element, of the second sensor element and of the magnetic properties of the at least one test magnet are largely corrected.

Example 15 is a sensor device according to one of the preceding examples, wherein the maximum absolute magnetic field strength of the magnetic test field is in a range of 1% to 10% of the upper limit of the measurement range of the first sensor element or of the second sensor element.

Example 16 is a sensor device according to one of examples 5 to 15, also comprising: a third sensor element which is designed to capture a magnetic field and to provide a third sensor signal, wherein the third sensor signal comprises a third signal contribution on the basis of the magnetic test field; and a fourth sensor element which is designed to capture a magnetic field and to provide a fourth sensor signal, wherein the fourth sensor signal comprises a fourth signal contribution on the basis of the magnetic test field, wherein the third sensor element and the fourth sensor element are sensitive in an identical second magnetic field direction or second magnetic field plane, wherein the second sensitive direction or the second sensitive plane is not parallel to the first sensitive direction or the first sensitive plane of the first and second sensor elements, and wherein the evaluation unit is designed to form a second comparison value from the third sensor signal and the fourth sensor signal and to check whether the second comparison value is within a second predefined range of values, wherein the second range of values is based on the magnetic test field.

Example 17 is a sensor device according to one of the preceding examples, wherein the sensor device is designed to operate as a position sensor or a magnetic current sensor.

Example 18 is a method comprising: providing a magnetic test field; providing a first sensor signal using a first sensor element, wherein the first sensor signal comprises a first signal contribution on the basis of the magnetic test field; providing a second sensor signal using a second sensor element, wherein the second sensor signal comprises a second signal contribution on the basis of the magnetic test field, wherein the magnetic test field at the location of the first sensor element differs from the magnetic test field at the location of the second sensor element.

Example 19 is a method according to example 18, also comprising: forming a comparison value from the first sensor signal and the second sensor signal; and checking whether the comparison value is within a predefined range of values, wherein the range of values is based on the magnetic test field.

Example 20 is a method according to claim 19, also comprising: indicating unreliable operation of at least one of the first sensor element or the second sensor element if the comparison value is outside the predefined range of values.

Although specific implementations have been illustrated and described herein, it is obvious to an average person skilled in the art that a multiplicity of alternative and/or equivalent implementations can replace the specific implementations described and shown without departing from the scope of the present disclosure. This application is intended to cover all adaptations or variations of the specific implementations discussed herein. The intention is therefore for this disclosure to be limited only by the claims and their equivalents.

The invention claimed is:

1. A sensor device comprising:
   at least one test magnet configured to provide a magnetic test field,
      wherein the at least one test magnet comprises at least a first test magnet and a second test magnet;
   a first sensor element configured to capture a first magnetic field and to provide a first sensor signal, wherein the first sensor signal comprises a first signal contribution based on the magnetic test field; and
   a second sensor element configured to capture a second magnetic field and to provide a second sensor signal, wherein the second sensor signal comprises a second signal contribution based on the magnetic test field, wherein the magnetic test field at a location of the first sensor element differs from the magnetic test field at a location of the second sensor element, and wherein the first test magnet is arranged beside the first sensor element and the second test magnet is arranged beside the second sensor element.

2. The sensor device as claimed in claim 1, further comprising:

an evaluation unit configured to form a comparison value from the first sensor signal and the second sensor signal and to check whether the comparison value is within a predefined range of values, wherein the range of values is based on the magnetic test field.

3. The sensor device as claimed in claim 2, wherein the evaluation unit is configured to indicate unreliable operation of at least one of the first sensor element or the second sensor element if the comparison value is outside the predefined range of values.

4. The sensor device as claimed in claim 1, wherein the first sensor element and the second sensor element are each configured to capture an absolute magnetic field strength associated with at least one of the first magnetic field or the second magnetic field.

5. The sensor device as claimed in claim 1, wherein the first sensor element and the second sensor element are sensitive in an identical first magnetic field direction or first magnetic field plane.

6. The sensor device as claimed in claim 5, wherein the magnetic test field has a first magnetic field strength at the location of the first sensor element in a first sensitive direction or a first sensitive plane and has a second magnetic field strength at the location of the second sensor element in the first sensitive direction or the first sensitive plane, and wherein the first magnetic field strength and the second magnetic field strength differ from one another.

7. The sensor device as claimed in claim 6, wherein the first magnetic field strength and the second magnetic field strength have an identical absolute value and different signs.

8. The sensor device as claimed in claim 2, wherein the evaluation unit is configured to form an absolute value difference from a first magnetic field strength and a second magnetic field strength and to check whether the absolute value difference is in a range $[a \cdot B_{test}-\varepsilon; a \cdot B_{test}+\varepsilon]$, wherein $B_{test}$ is the absolute value of the first magnetic field strength and of the second magnetic field strength, wherein $\varepsilon$ is a predetermined tolerance value, wherein a is a scaling factor in the range of 0 to 2, and wherein a results from a position of the at least one test magnet with respect to the first sensor element and with respect to the second sensor element.

9. The sensor device as claimed in claim 1, further comprising:

an encapsulation material, wherein the first sensor element and the second sensor element are at least partially encapsulated by the encapsulation material.

10. The sensor device as claimed in claim 9, wherein the encapsulation material is at least partially magnetized and forms at least one part of the at least one test magnet.

11. The sensor device as claimed in claim 1, wherein the at least one test magnet comprises at least one permanent magnet.

12. The sensor device as claimed in claim 1, wherein the first sensor element and the second sensor element have substantially the same sensor characteristic.

13. The sensor device as claimed in claim 2, wherein the evaluation unit is configured to carry out a temperature compensation for a predefined range of values, with a result that temperature dependencies of the first sensor element, of the second sensor element and of magnetic properties of the at least one test magnet are largely corrected.

14. The sensor device as claimed in claim 1, wherein the maximum absolute magnetic field strength of the magnetic test field is in a range of 1% to 10% of an upper limit of a measurement range of the first sensor element or of the second sensor element.

15. The sensor device as claimed in claim 6, further comprising:

a third sensor element which is configured to capture a third magnetic field and to provide a third sensor signal, wherein the third sensor signal comprises a third signal contribution based on the magnetic test field; and a fourth sensor element which is configured to capture a fourth magnetic field and to provide a fourth sensor signal, wherein the fourth sensor signal comprises a fourth signal contribution based on the magnetic test field, wherein the third sensor element and the fourth sensor element are sensitive in an identical second magnetic field direction or second magnetic field plane, wherein a second sensitive direction or a second sensitive plane is not parallel to the first sensitive direction or the first sensitive plane of the first and second sensor elements, and wherein an evaluation unit is configured to form a second comparison value from the third sensor signal and the fourth sensor signal and to check whether the second comparison value is within a second range of values, wherein the second range of values is based on the magnetic test field.

16. The sensor device as claimed in claim 1, wherein the sensor device is configured to operate as a position sensor or a magnetic current sensor.

17. A method comprising:

providing a magnetic test field, wherein the magnetic test filed is provided by at least one test magnet comprising a first test magnet and a second test magnet;

providing a first sensor signal by a first sensor element, wherein the first sensor signal comprises a first signal contribution based on the magnetic test field; and providing a second sensor signal by a second sensor element, wherein the second sensor signal comprises a second signal contribution based on the magnetic test field, wherein the magnetic test field at a location of the first sensor element differs from the magnetic test field at a location of the second sensor element, and wherein the first test magnet is arranged beside the first sensor element and the second test magnet is arranged beside the second sensor element.

18. The method as claimed in claim 17, further comprising:

forming a comparison value from the first sensor signal and the second sensor signal; and checking whether the comparison value is within a predefined range of values, wherein the range of values is based on the magnetic test field.

19. The method as claimed in claim 18, further comprising: indicating unreliable operation of at least one of the first sensor element or the second sensor element if the comparison value is outside the predefined range of values.

20. The method as claimed in claim 17, wherein the first sensor element and the second sensor element are at least partially encapsulated by an encapsulation material, and wherein the encapsulation material is at least partially magnetized and forms at least one part of the at least one test magnet.

\* \* \* \* \*